United States Patent [19]

Sako

[11] Patent Number: 5,317,194

[45] Date of Patent: May 31, 1994

[54] RESIN-SEALED SEMICONDUCTOR DEVICE HAVING INTERMEDIATE SILICON THERMAL DISSIPATION MEANS AND EMBEDDED HEAT SINK

[75] Inventor: Shigeki Sako, Yokohama, Japan

[73] Assignee: Kabushiki Kaisha Toshiba, Kanagawa, Japan

[21] Appl. No.: 23,862

[22] Filed: Feb. 25, 1993

Related U.S. Application Data

[63] Continuation of Ser. No. 688,619, Jun. 14, 1991, abandoned.

[30] Foreign Application Priority Data

Oct. 17, 1989 [JP]  Japan .................................. 1-269663

[51] Int. Cl.$^5$ ..................... H01L 23/02; H01L 25/04; H01L 23/28; H01L 23/12
[52] U.S. Cl. ................................. 257/777; 257/712; 257/717; 257/720; 257/723; 257/796
[58] Field of Search .................. 357/80, 81, 71, 72, 357/75; 257/777, 778, 659, 698, 705, 706, 707, 712, 717, 720, 723, 796

[56] References Cited

U.S. PATENT DOCUMENTS

| | | | |
|---|---|---|---|
| 3,471,752 | 10/1969 | Pfander et al. | 257/777 |
| 4,322,735 | 6/1982 | Sadamasa et al. | 357/75 |
| 4,654,692 | 3/1987 | Sakurai et al. | 357/72 |
| 4,698,662 | 10/1987 | Young et al. | 357/81 |
| 4,705,606 | 11/1987 | Young et al. | 357/80 |

FOREIGN PATENT DOCUMENTS

| | | |
|---|---|---|
| 52-135670 | 11/1977 | Japan . |
| 53-102674 | 9/1978 | Japan . |
| 60-200558 | 10/1985 | Japan . |

Primary Examiner—Andrew J. James
Assistant Examiner—Carl Whitehead, Jr.
Attorney, Agent, or Firm—Finnegan, Henderson, Farabow, Garrett & Dunner

[57] ABSTRACT

The present invention relates to a semiconductor device sealed by a resin and, more particularly, to a semiconductor device for reducing a production cost and effectively radiating heat generated from a semiconductor element. For this reason, a silicon chip in which an insulating layer is formed between the surface of the silicon chip and a conductive layer is arranged between a heat sink and a semiconductor element. The silicon chip insulates the semiconductor element from the heat sink and transmits heat generated from the semiconductor element to the heat sink. The silicon chip can be manufactured in a line for manufacturing the semiconductor element, and the silicon chip can be assembled with the semiconductor element.

15 Claims, 2 Drawing Sheets

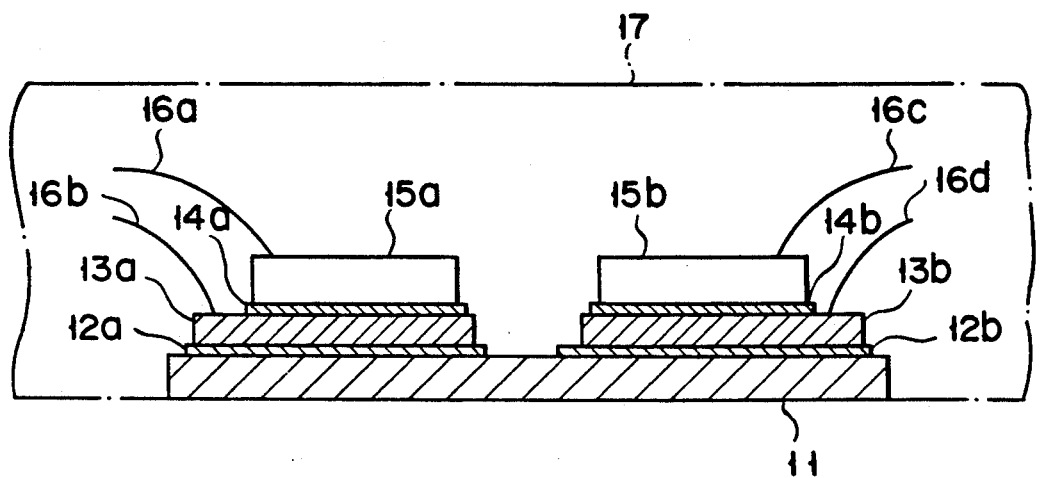
F I G. 1
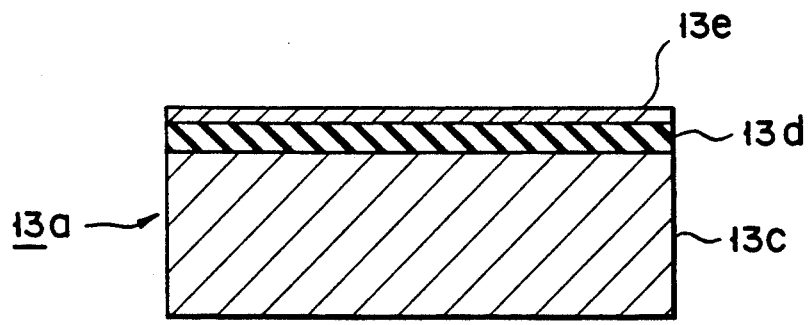
F I G. 2

RESIN-SEALED SEMICONDUCTOR DEVICE HAVING INTERMEDIATE SILICON THERMAL DISSIPATION MEANS AND EMBEDDED HEAT SINK

This application is a continuation of application Ser. No. 07/688,619, filed Jun. 14, 1991, now abandoned.

TECHNICAL FIELD

The present invention relates to a hybrid resin-sealed semiconductor device and, more particularly, to a resin-sealed semiconductor device having a power semiconductor element.

BACKGROUND ART

In a hybrid resin-sealed semiconductor device having a plurality of hybrid resin-sealed semiconductor elements, heat generated from the semiconductor elements must be effectively radiated. For this reason, the semiconductor elements must be arranged on a heat sink.

In the above resin-sealed semiconductor device, each semiconductor element constitutes an independent circuit in a package. For this reason, the elements, more specifically, collectors formed on the bottom surfaces of transistors must be insulated from each other. Therefore, the following arrangement is employed.

In FIG. 3, semiconductor elements 33a and 33b are formed on the heat sinks 31a and 31b through semiconductor pastes 32a and 32b, respectively, and wires 34a to 34d connected to inner leads (not shown) are bonded to predetermined portions of the heat sinks 31a and 31b and the semiconductor elements 33a and 33b, respectively.

With the above arrangement, since the heat sinks 31a and 31b are perfectly separated from each other, connection strength between a lead frame (not shown) and the heat sinks 31a and 31b is weakened. Therefore, after the wires 34a to 34d are bonded, the wires are probably disconnected by vibration in other manufacturing steps. This is a disadvantageous problem in the manufacture.

In FIG. 4, a conductive paste 42 and a ceramic plate 43 are formed on a heat sink 41, and a conductive material on the ceramic plate 43 is patterned to form inner leads 44a and 44b. Semiconductor elements 46a and 46b are formed on the inner leads 44a and 44b through conductive pastes 45a and 45b, respectively, and wires 47a to 47d are bonded to predetermined portions of the semiconductor elements 46a and 46b and inner leads 44a and 44b, respectively.

With the above arrangement, since a special-purpose device for arranging the ceramic plate 43 on the heat sink 41 must be used, the semiconductor device cannot be manufactured in a production line of a general-purpose semiconductor device. Therefore, a production cost is largely increased, and the unit cost of the semiconductor device is increased. In addition, the thin ceramic plate having a large area is easily cracked, and it cannot be easily treated.

In FIG. 5, inner leads 52a and 52b are arranged to be separated from a heat sink 51, and semiconductor elements 54a and 54b are formed on the inner leads 52a and 52b through conductive pastes 53a and 53b, respectively. Wires 55a and 55b are bonded to predetermined portions of the semiconductor elements 54a and 54b, respectively.

With the above arrangement, the inner leads 52a and 52b cannot easily be processed. In addition, in order to obtain effective heat radiation, the inner leads 52a and 52b having the semiconductor elements 54a and 54b must be formed as close to the heat sink 51 as possible, and the inner leads 52a and 52b and the heat sink 51 must be assembled with strict accuracy. This accuracy largely influences heat-radiation characteristics of the semiconductor device, i.e., the characteristics of the semiconductor device and causes the product yield of the semiconductor to decrease. Therefore, the semiconductor device cannot be manufactured in mass production.

In FIGS. 3 to 5, although the conductive pastes 32a, 32b, 42, 45a, 45b, 53a, and 53b are used, soldering may be used in place of the conductive pastes.

It is an object of the present invention to provide a resin-sealed semiconductor device capable of reliably insulating semiconductor elements from each other, effectively radiating heat generated from the semiconductor elements, and reducing a manufacturing cost to be low.

DISCLOSURE OF INVENTION

The present invention is achieved by the following arrangement.

A semiconductor device characterized by comprising a heat sink,
a plurality of semiconductor elements arranged on an upper surface of said heat sink, and
heat-radiating silicon chips arranged between said semiconductor elements and said heat sink, each of said heat-radiating silicon chips including a silicon layer, an insulating layer, and a conductive layer, said insulating layer being formed on the surface of the silicon layer; and said conductive layer being formed on the insulating layer.

According to the present invention, a silicon chip in which a conductive layer is formed on the surface of a silicon layer through an insulating layer is arranged between a heat sink and a semiconductor element. The silicon chip insulates the semiconductor element from the heat sink and transmits heat generated from the semiconductor element to the heat sink. Since the silicon chip can be manufactured in a line for manufacturing the semiconductor element and assembled with the semiconductor element, the silicon chip is easily manufactured, and the production cost thereof can be reduced to be low.

BRIEF DESCRIPTION OF DRAWINGS

FIG. 1 is a sectional view showing a resin-sealed semiconductor device according to an embodiment of the present invention, FIG. 2 is a sectional view showing a main part of the resin-sealed semiconductor device in FIG. 1, and FIGS. 3 to 5 are sectional views showing main parts of a conventional resin-sealed semiconductor device.

BEST MODE FOR CARRYING OUT THE INVENTION

Figure 3:
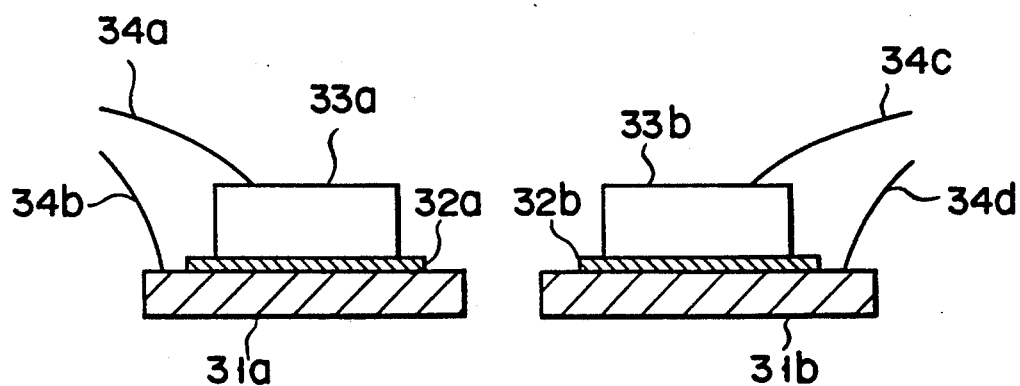
Figure 4:
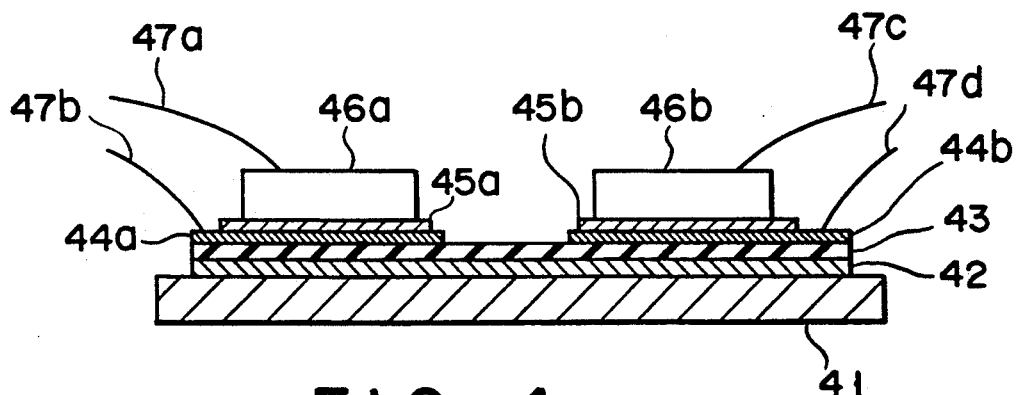
Figure 5:
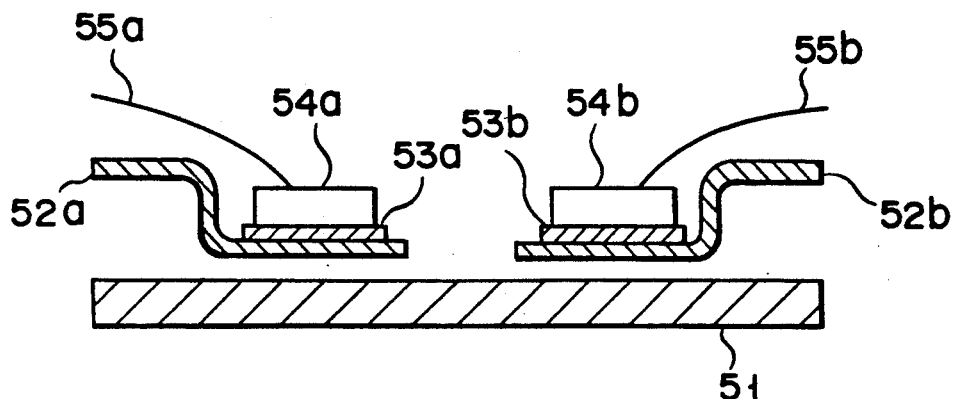

An embodiment of the present invention will be described below with reference to the accompanying drawings.

In FIG. 1, conductive pastes 12a and 12b are provided on the surface of a heat sink 11, silicon chips 13a and 13b are formed on the conductive pastes 12a and 12b. Since the silicon chips 13a and 13b have the same arrangement, only the arrangement of the chip 13a will be described below.

FIG. 2 shows a silicon chip 13a.

An insulating film 13d made of, e.g., SiO$_2$ is formed on the surface of a silicon layer 13c by a normal pellet process. The thickness of the insulating film 13d can be changed according to a breakdown voltage of a semiconductor element used in this embodiment. A conductor 13e made of Al or Au is deposited on the surface of the insulating film 13d.

Conductive pastes 14a and 14b are provided on the silicon chips 13a and 13b. Power semiconductor elements 15a and 15b are formed on the conductive pastes 14a and 14b, respectively. That is, the collectors of the semiconductor elements 15a and 15b are connected to conductors 13e of the silicon chips 13a and 13b through the conductive pastes 14a and 14b. Wires 16a to 16d are bonded to predetermined portions of the semiconductor elements 15a and 15b and the conductors 13e of the silicon chips 13a and 13b. Thereafter, the resultant structure except for the bottom surface of the heat sink 11 is molded by a resin 17.

With the above arrangement, the silicon chips 13a and 13b are interposed between the heat sink 11 and the semiconductor elements 15a and 15b, and the semiconductor elements 15a and 15b are arranged on the heat sink 11 through the silicon chips 13a and 13b, respectively. Therefore, the semiconductor elements 15a and 15b are reliably insulated from the heat sink by the silicon chips 13a and 13b, and heat generated from the semiconductor elements 15a and 15b can be transmitted to the heat sink 11 through the silicon chips 13a and 13b.

In addition, since the silicon chips 13a and 13b can be manufactured in the same production line as that of the semiconductor elements 15a and 15b, a production cost can be decreased compared with a conventional semiconductor device using a ceramic plate.

Since uniform quality can be assured in the silicon chips 13a and 13b by a normal manufacturing process, a high product yield can be assured.

The heat conductivity of silicon is 168 (W.m$^{-1}$.K$^{-1}$), and the heat conductivity of ceramic is 210 (W.m$^{-1}$.K$^{-1}$). Therefore, a silicon layer is likely to be disadvantageous. However, although the minimum thickness of a ceramic layer is 0.5 mm, the minimum thickness of a silicon layer is 0.4 to 0.13 mm. When the silicon layer has a thickness of 0.4 mm or less, the silicon layer has a heat radiation effect as large as or larger than the ceramic layer. Heat generated from a semiconductor element by a silicon chip can be sufficiently radiated.

Since the silicon chips 13a and 13b are fixed on the heat sink 11, disconnection of wires by vibration in a manufacturing step after wire bonding can be reduced.

In the above embodiment, the conductive pastes 12a, 12b, 14a, and 14b are used. However, the present invention is not limited to the embodiment, and soldering may be used.

Various modifications can be made without departing from the spirit and scope of the invention.

INDUSTRIAL APPLICABILITY

As described above, according to the present invention, a silicon chip in which an insulating layer is formed between the surface of the silicon layer and a conductive layer is arranged between a heat sink and a semiconductor element. The silicon chip insulates the semiconductor element from the heat sink and effectively transmits heat generated from the semiconductor element to the heat sink. In addition, since the silicon chip can be manufactured in a line for manufacturing the semiconductor element and assembled with the semiconductor element, the silicon chip is easily manufactured, and the production cost thereof can be reduced. Therefore, industrial applicability of the invention is high.

I claim:

1. A semiconductor device comprising:
   a heat sink;
   a plurality of heat-radiating silicon chips arranged on said heat sink; and
   a plurality of semiconductor elements arranged on the heat-radiating silicon chips, respectively;
   the heat-radiating silicon chips each including a silicon layer having a surface, an electrically insulating layer, and an electrically conductive layer, the electrically insulating layer being formed on the surface of the silicon layer, and the electrically conductive layer being formed on the electrically insulating layer.

2. A semiconductor device according to claim 1, wherein said silicon layer has a thickness of 0.4 to 0.13 mm.

3. A semiconductor device according to claim 1, wherein said electrically insulating layer is an oxide film.

4. A semiconductor device according to claim 1, wherein said electrically conductive layer is made of aluminum.

5. A semiconductor device according to claim 1, wherein said electrically conductive layer is made of gold.

6. A semiconductor device according to claim 1, wherein said silicon chips and said semiconductor elements are sealed by resin except for a bottom surface of said heat sink.

7. A semiconductor device according to claim 1, wherein said semiconductor elements are power semiconductor elements.

8. A semiconductor device according to claim 1, wherein a wire is bonded to said conductive layer.

9. A semiconductor device comprising:
   a heat sink;
   a plurality of heat-radiating silicon chips arranged on said heat sink;
   conductive pastes provided on the plurality of heat-radiating silicon chips;
   a plurality of semiconductor elements arranged on the conductive pastes, respectively; and
   a resin for sealing said silicon chips and said semiconductor elements except for a bottom surface of said heat sink;
   the heat-radiating silicon chips each including a silicon layer having a surface, an electrically insulating layer, and an electrically conductive layer, the electrically insulating layer being formed on the surface of the silicon layer, and the electrically conductive layer being formed on the electrically insulating layer.

10. A semiconductor device comprising:
    a heat sink;
    a plurality of heat-radiating silicon chips arranged on said heat sink, said heat-radiating silicon chips each including a silicon layer having a surface, an electrically insulating layer, and an electrically conductive layer, said electrically insulating layer being formed on the surface of the silicon layer, and said electrically conductive layer being formed on the insulating layer;

a plurality of semiconductor elements having electrode with a bottom surface arranged on the heat-radiating silicon chips, respectively, the electrodes of the semiconductor elements being connected to the conductive layers of the heat-radiating silicon chips, respectively;

a plurality of wires connected to said semiconductor elements and said conductive layers, respectively; and a resin for sealing said silicon chips and said semiconductor elements except for a bottom surface of said heat sink.

11. A semiconductor device comprising:

a heat sink;

a plurality of heat-radiating silicon chips arranged on the heat sink;

a plurality of power semiconductor elements having collectors with a bottom surface arranged on the heat-radiating silicon chips, respectively;

the heat-radiating silicon chips each including a silicon layer having a surface, an electrically insulating layer, and an electrically conductive layer for connecting to collectors of the power semiconductor elements, the electrically insulating layer being formed on the surface of the silicon layer, and the electrically conductive layer being formed on the insulating layer.

12. A semiconductor device according to claim 11, wherein the silicon layer has a thickness of 0.4 to 0.13 mm.

13. A semiconductor device according to claim 11, wherein the insulating layer is an oxide film.

14. A semiconductor device according to claim 11, wherein the conductive layer is made of aluminium.

15. A semiconductor device according to claim 11, wherein the conductive layer is made of gold.

* * * * *

UNITED STATES PATENT AND TRADEMARK OFFICE
CERTIFICATE OF CORRECTION

PATENT NO. : 5,317,194
DATED : May 31, 1994
INVENTOR(S) : Shigeki SAKU

It is certified that error appears in the above-identified patent and that said Letters Patent is hereby corrected as shown below:

Claim 8, column 4, line 40, before "conductive" insert --electrically--

Claim 10, column 4, line 68, before "insulating" insert --electrically--.

Claim 10, column 5, lines 1 and 2, change "electrode" to --electrodes--.

Claim 10 column 5, line 5, before "conductive" insert --electrically--.

Claim 10 column 5, line 8 before "conductive" insert --electrically--.

UNITED STATES PATENT AND TRADEMARK OFFICE
CERTIFICATE OF CORRECTION

PATENT NO. : 5,317,194
DATED : May 31, 1994
INVENTOR(S) : Shigeki SAKU

It is certified that error appears in the above-identified patent and that said Letters Patent is hereby corrected as shown below:

Claim 11, column 6, line 11 before "insulating" insert --electrically--.

Claim 13, column 6, line 16 before "insulating" insert --electrically--.

Claim 14, column 6, line 18 before, "conductive" insert --electrically--.

Claim 15, column 6, line 20, before "conductive" insert --electrically--.

Signed and Sealed this

Eleventh Day of April, 1995

*Attest:*

BRUCE LEHMAN

*Attesting Officer*  *Commissioner of Patents and Trademarks*